United States Patent
Takasu et al.

(10) Patent No.: US 6,653,688 B2
(45) Date of Patent: Nov. 25, 2003

(54) SEMICONDUCTOR DEVICE

(75) Inventors: Hiroaki Takasu, Chiba (JP); Jun Osanai, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 10/116,666

(22) Filed: Apr. 3, 2002

(65) Prior Publication Data

US 2002/0153568 A1 Oct. 24, 2002

(30) Foreign Application Priority Data

Apr. 10, 2001 (JP) ........................................ 2001-111468
Apr. 10, 2001 (JP) ........................................ 2001-111469

(51) Int. Cl.$^7$ ............................................. H01L 23/62
(52) U.S. Cl. ................. 257/360; 257/363; 257/379; 257/380; 257/536; 257/537; 257/538
(58) Field of Search ................. 257/350, 358, 257/359, 360, 363, 379, 380, 536, 537, 538, 50, 530; 438/382, 384, 308, 378

(56) References Cited

U.S. PATENT DOCUMENTS 5,602,053 A * 2/1997 Zheng et al. ................ 438/600
5,682,059 A * 10/1997 Yoshii et al. ................ 257/530
6,441,461 B1 * 8/2002 Takasu ........................ 257/538
2001/0041412 A1 * 11/2001 Takasu ........................ 438/381
2002/0084492 A1 * 7/2002 Osanai et al. ................ 257/369
2002/0163047 A1 * 11/2002 Takasu ........................ 257/379

* cited by examiner

Primary Examiner—Thien Tran
(74) Attorney, Agent, or Firm—Adams & Wilks

(57) ABSTRACT

A semiconductor device comprises a MOS transistor and a resistor. The resistor has a P-type resistor formed from a P-type semiconductor, an N-type resistor formed from an N-type semiconductor and disposed adjacent the P-type resistor, and an insulating film disposed between the P-type and N-type resistors. The P-type resistor is arranged at the low potential side of the semiconductor device and the N-type resistor is arranged at the high potential side thereof. A portion of the insulating film between the P-type and N-type resistors is made electrically conductive by irradiating the portion with a laser beam to destroy the insulating property thereof to thereby achieve conductivity between the P-type and N-type resistors. A gate electrode of the MOS transistor is formed of a P-type polysilicon thin film having the same high concentration impurity as that of the region where the P-type resistor is in contact with a metal wiring, thereby enhancing the current driving capacity of a driver MOS.

10 Claims, 3 Drawing Sheets

SEMICONDUCTOR DEVICE

BACKGROUND OF THE INVENTION

1. Field of the Invention

The present invention relates to a semiconductor device, and more particularly, to a semiconductor device having a resistor, a bleeder resistance circuit employing a resistor and a semiconductor device including the bleeder resistance circuit.

2. Description of the Related Art

Up to now, resistors formed from a semiconductor thin film such as polysilicon or bleeder resistance circuits using the resistors have been employed in many cases, and there is such a well-known product that is formed from a semiconductor thin film of either N-type conductivity type or P-type conductivity type. Normally, a gate electrode of a MOS transistor is formed from an N-type polysilicon thin film. In some cases, a so-called homopolar gate electrode is well-known, in which an N-type gate electrode is imparted to NMOS and a P-type gate electrode is imparted to PMOS, in view of placing importance on performance thereof. Also, there is well-known such a method in which a polysilicon fuse is disconnected by being subjected to laser trimming and the connection of a bleeder resistance circuit is changed to obtain a desired voltage division ratio of a voltage. Further, ICs such as a voltage detector and a voltage regulator are fabricated by using the above.

However, when the conventional thin film resistor is subjected to resin-packaging or the like, that is, when stress is applied to the thin film resistor, the resistance value is caused to vary, resulting in that there is a problem in that the bleeder resistance circuit frequently includes the change of the voltage division ratio after resin-packaging. Further, in the conventional laser trimming method, it is necessary to mount a fuse in order to conduct trimming through a laser beam in addition to the bleeder resistance circuit.

SUMMARY OF THE INVENTION

The present invention has been made in order to solve the above problem, and an object of the present invention is therefore to obtain a high-precision bleeder resistance circuit, in which an initial resistance value is maintained even after packaging and an accurate voltage division ratio is kept in the bleeder resistance circuit, and to provide a compact and high-precision semiconductor device without the installation of a fuse that has been conventionally required, such as a voltage detector or a voltage regulator with high performance and at low cost.

In a first means that is adopted so as to achieve the above object in a semiconductor device according to the present invention, resistors and resistors of a bleeder resistance circuit employing them are composed of a P-type resistor that is formed from a P-type semiconductor and an N-type resistor that is formed from an N-type semiconductor. Further, the bleeder resistance circuit is characterized in that a resistance value that serves as a single unit is regulated by the resistance value obtained by coupling the P-type resistor with the N-type resistor, thereby offsetting the changes of the resistance values to each other which occur in the P-type resistor and the N-type resistor due to a piezo effect described below.

The description of the change of the resistance value due to the piezo effect and an influence that is exerted on the bleeder resistance circuit will be made below.

When stress is applied to the resistor, the resistance value of the resistor is changed by the so-called piezo effect, and the direction of the change of the resistance value becomes reverse between the P-type resistor and the N-type resistor. This has been confirmed by experiments of the present inventor as well. For example, the resistance value of the P-type resistor decreases and the resistance value of the N-type resistor increases. (The direction of the change is changed in accordance with the direction in which stress is applied.)

When conducting resin-packaging of an IC, stress is generated. Thus, the resistance value of the resistor is changed due to the piezo effect as described the above. The bleeder resistance circuit is constituted so as to obtain an accurate voltage division ratio, however, the resistance value of each resistor is changed, resulting in that the voltage division ratio is also changed.

The resistor according to the present invention is composed of the P-type resistor that is formed from the P-type semiconductor and the N-type resistor that is formed from the N-type semiconductor. Therefore, even when stress is applied, it is possible to prevent the resistance value from being changed. Also, in the bleeder resistance circuit, the resistance value that serves as the single unit is regulated by the resistance value obtained by coupling the P-type resistor with the N-type resistor. Thus, even when stress is applied, the changes of the resistance values of the individual resistors offset each other, thereby being capable of maintaining the accurate voltage division ratio.

A second means that is adopted so as to achieve the above object in a semiconductor device according to the present invention is characterized in that a P-type resistor is disposed at a low potential side and an N-type resistor is disposed at a high potential side, the P-type resistor is separated from the N-type resistor by an insulating film, the resistors remain in a state where a current does not flow as long as no additional action is performed, and a laser beam is irradiated to only a necessary portion of the insulating film portion to destroy the insulating property thereof to thereby achieve conductivity between the P-type and N-type resistors. Accordingly, a fuse that has been conventionally required is unnecessary.

A third means that is adopted so as to achieve the above object in a semiconductor device according to the present invention is characterized in that a gate electrode of a MOS transistor and a P-type resistor are formed of the same polysilicon thin film and a high concentration impurity region of the P-type resistor for making electrical connection with a metal wiring is formed from a polysilicon thin film having the same impurity and impurity concentration as those of the gate electrode of the MOS transistor. Accordingly, the performance of the P-type MOS transistor can be improved at low cost without increasing the number of manufacturing processes.

EFFECT

A resistor of a semiconductor device according to the present invention is composed of a P-type resistor that is formed from a P-type semiconductor and an N-type resistor that is formed from an N-type semiconductor. Therefore, even when stress is applied by resin-packaging or the like, the changes of the resistance values of individual resistors offset each other, thereby being capable of maintaining an initial resistance value. Also, in a bleeder resistance circuit, the resistance value that serves as a single unit is regulated by the resistance value obtained by coupling the P-type resistor with the N-type resistor, thereby being capable of maintaining an accurate voltage division ratio. Further, the P-type resistor is disposed at a low potential side and the N-type resistor is disposed at a high potential side, and the resistors are adjacently arranged via an insulating film. A laser beam or the like is irradiated to an insulating film portion to destroy the insulating property thereof to thereby achieve conductivity between the P-type and N-type resistors. Thus, a fuse that has been required in a conventional manner can be made unnecessary. Still further, a gate electrode of a MOS transistor and the P-type resistor are formed of the same polysilicon thin film, and a high concentration impurity region of the P-type resistor for making electrical connection with a metal wiring is formed from a polysilicon thin film having the same impurity and impurity concentration as those of the gate electrode of the MOS transistor. Accordingly, the performance of the P-type MOS transistor can be improved without increasing the number of manufacturing processes.

When the above bleeder resistance circuit is employed, a compact and high-precision semiconductor device such as a voltage detector or a voltage regulator can be obtained.

DETAILED DESCRIPTION OF THE PREFERRED EMBODIMENTS

Preferred embodiments of the present invention will be described below with reference to the drawings.

Figure 1:
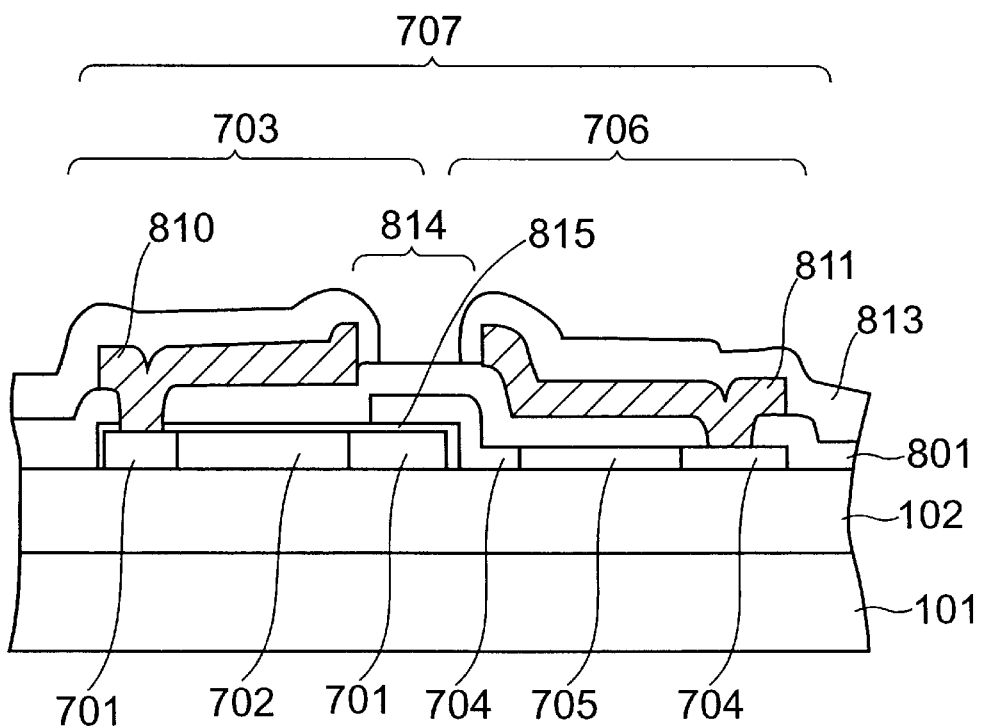
FIG. 1 is a schematic sectional view showing an embodiment of a semiconductor thin film resistor of a semiconductor device according to the present invention.

FIG. 1 is a schematic sectional view showing an embodiment of a polysilicon thin film resistor of a semiconductor device according to the present invention.

A first insulating film 102 is formed on a semiconductor substrate 101. On the first insulating film 102, a P-type polysilicon resistor 703, which comprises a P-type high resistance region 702 that is sandwiched between P-type low resistance regions 701 containing a high concentration P-type impurity, and an N-type polysilicon resistor 706, which comprises an N-type high resistance region 705 that is sandwiched between N-type low resistance regions 704 containing a high concentration N-type impurity, are disposed such that one of the P-type low resistance regions 701 comes into contact with one of the N-type low resistance regions 704 via a thin insulating film 815, and a resistor 707 is formed which is composed of a pair of the P-type polysilicon resistor 703 and the N-type polysilicon resistor 706. Also, a wiring 810 made of aluminum is connected with the P-type low resistance region 701 at the side with which the N-type polysilicon resistor 706 is not contacted and a wiring 811 made of aluminum is connected with the N-type low resistance region 704 at the side with which the P-type polysilicon resistor 703 is not contacted. In this case, for example, the wiring 810 is connected with a VSS side and the wiring 811 is connected with a VDD side, such that the wiring 810 is set to be connected with a potential lower than that of the wiring 811. Further, a protective film 813 comprised of a silicon nitride film or the like is formed on the resistor 707 except for an area 814 to which a laser beam is irradiated to impart damage to the insulating film 815 to thereby eliminate or destroy the insulating property thereof so that one of the P-type low resistance regions 701 is brought into electrical contact with one of the N-type low resistance regions 704.

In this case, even when stress is applied by resin-packaging or the like, the change of the resistance value of the P-type polysilicon resistor 703 and the change of the resistance value of the N-type polysilicon resistor 706 can be offset to each other, resulting in that the resistance value of the resistor 707, which is obtained by coupling the P-type polysilicon resistor 703 with the N-type polysilicon resistor 706, can remain at an initial resistance value.

In FIG. 1, only an example in which one P-type polysilicon resistors 703 is coupled with one N-type polysilicon resistors 706 is illustrated. However, a bleeder resistance circuit is composed of the resistor 707 that is obtained by coupling a plurality of P-type polysilicon resistors 703 with a plurality of N-type polysilicon resistors 706.

Further, the resistor 707 that is obtained by coupling the P-type polysilicon resistor 703 with the N-type polysilicon resistor 706 shown in FIG. 1 is regulated as a single unit of a bleeder circuit and the entire bleeder circuit is composed by forming a plurality of resistors 707. In this case, even when stress is applied by resin-packaging or the like, the accurate voltage division ratio can be maintained. By employing the above bleeder resistance circuit, a high-precision semiconductor device such as a voltage detector or a voltage regulator can be obtained.

Also, in FIG. 1, an example employing a polysilicon thin film resistor is illustrated, but the present invention is not limited to this. A single crystal thin film resistor, a diffusion resistor that is formed in a silicon substrate, and the like are applicable as long as the formation is made by integrating a P-type resistor with an N-type resistor.

Further, according to the embodiment shown in FIG. 1, when laser trimming is conducted to the resistor 707, the desired voltage division ratio of the bleeder resistance circuit can be obtained, with the result that a fuse that has been conventionally required for performing disconnection through a laser beam becomes unnecessary. Note that, in the embodiment of FIG. 1, the protective film 813 that is comprised of a silicon nitride film or the like is formed on the resistor 707 except for the area 814 to which a laser beam is irradiated to impart damage to the insulating film 815 to thereby eliminate insulating property and in which one of the P-type low resistance regions 701 is brought into contact with one of the N-type low resistance regions 704. However, even when the protective film 813 exists, the protective film 813 maybe formed even on the area 814 in which one of the P-type low resistance regions 701 is brought into contact with one of the N-type low resistance regions 704 in the case where insulating property can be destroyed through a laser beam.

Still further, although not shown in the figure, a gate electrode of a MOS transistor that is mounted on the same chip together with the resistor 707 is formed of the polysilicon thin film that is same as that of the P-type polysilicon resistor 703. Then, the gate electrode of the MOS transistor is formed from the P-type polysilicon thin film containing the same impurity and impurity concentration as those of the P-type low resistance region 701 containing the high concentration P-type impurity, and the forming process is entirely the same as that for the P-type low resistance region 701 in the P-type polysilicon resistor 703. Therefore, without adding special processes, the gate electrode having the P-type impurity can be formed, which is suitable specifically for enhancing the performance of the P-type MOS transistor. At this time, there are some cases where the performance of the N-type MOS transistor is slightly decreased. However, as described below, in most of the cases of a power source control IC such as a voltage regulator, the P-type MOS transistor is employed as a driver transistor, resulting in that this is more preferable in many cases.

Figure 2:
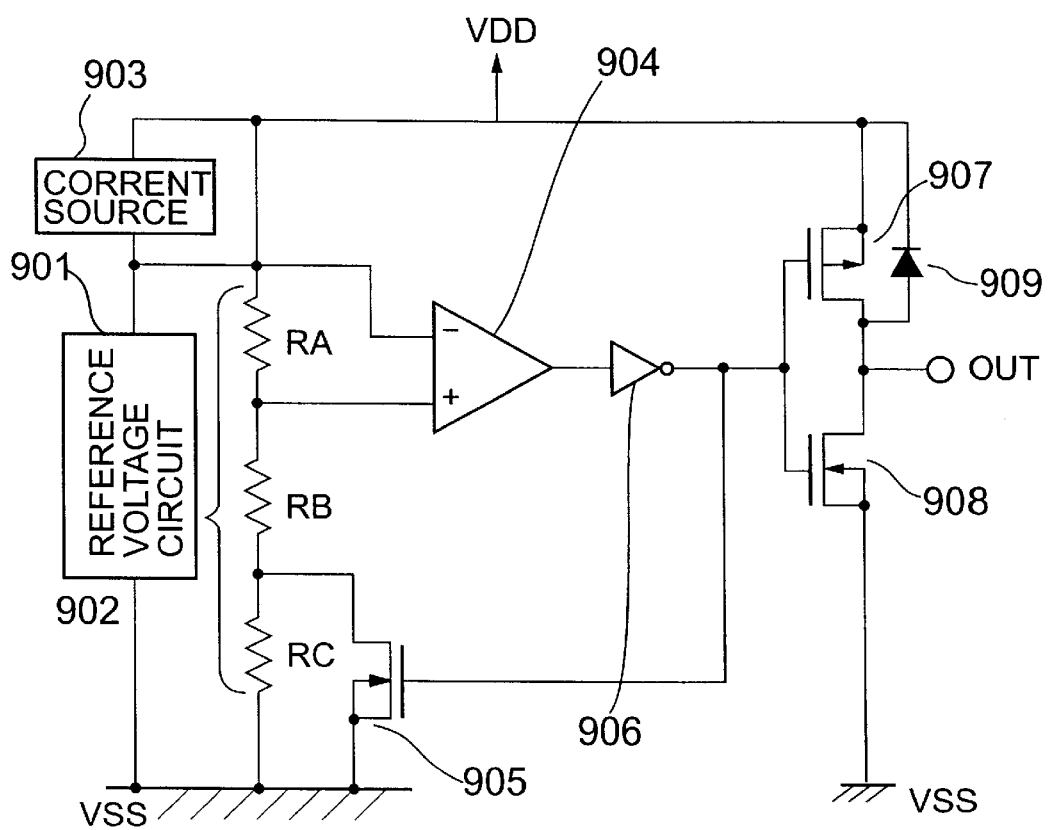
FIG. 2 is a block diagram showing an embodiment of a voltage detector that employs a bleeder resistance circuit according to the present invention.

FIG. 2 is a block diagram showing an embodiment of a voltage detector that employs a bleeder resistance circuit according to the present invention.

An example of a simple circuit is illustrated in order to describe briefly. However, the functions of an actual production may be added, if necessary.

The basic circuit components of the voltage detector comprise a current source 903, a reference voltage circuit 901, a bleeder resistance circuit 902, and an error amplifier 904. Further, an inverter 906, N-type transistors 905 and 908, a P-type transistor 907 and the like are added. The partial description of operations is briefly made below.

When a VDD is at the level of a predetermined release voltage or more, the N-type transistors 905, 908 are turned off and the P-type transistor 907 is turned on. Then a VDD is output at an output OUT. In this case, the input voltage of the error amplifier 904 is expressed by (RB+RC)/(RA+RB+RC)*VDD.

When the VDD is decreased to be at the level of a detection voltage or smaller, a VSS is output at the output OUT. In this case, the N-type transistor 905 is turned on and the input voltage of the error amplifier 904 is expressed by RB/(RA+RB)*VDD.

Accordingly, in the case where the basic operations are performed by comparing the reference voltage generated in the reference voltage circuit 901 with the voltage divided by the bleeder resistance circuit 902 in the error amplifier 904. Thus, the accuracy of the voltage divided by the bleeder resistance circuit 902 becomes considerably important. When the accuracy of the voltage divided by the bleeder resistance circuit 902 is low, the input voltage to the error amplifier 904 is varied, thereby becoming impossible to obtain the predetermined release voltage or the detection voltage. When the bleeder resistance circuit according to the present invention is employed, the voltage division can be effected with high precision even after the resin-packaging of an IC. Therefore, production yield of ICs is improved and a voltage detector with higher precision can be manufactured.

Figure 3:
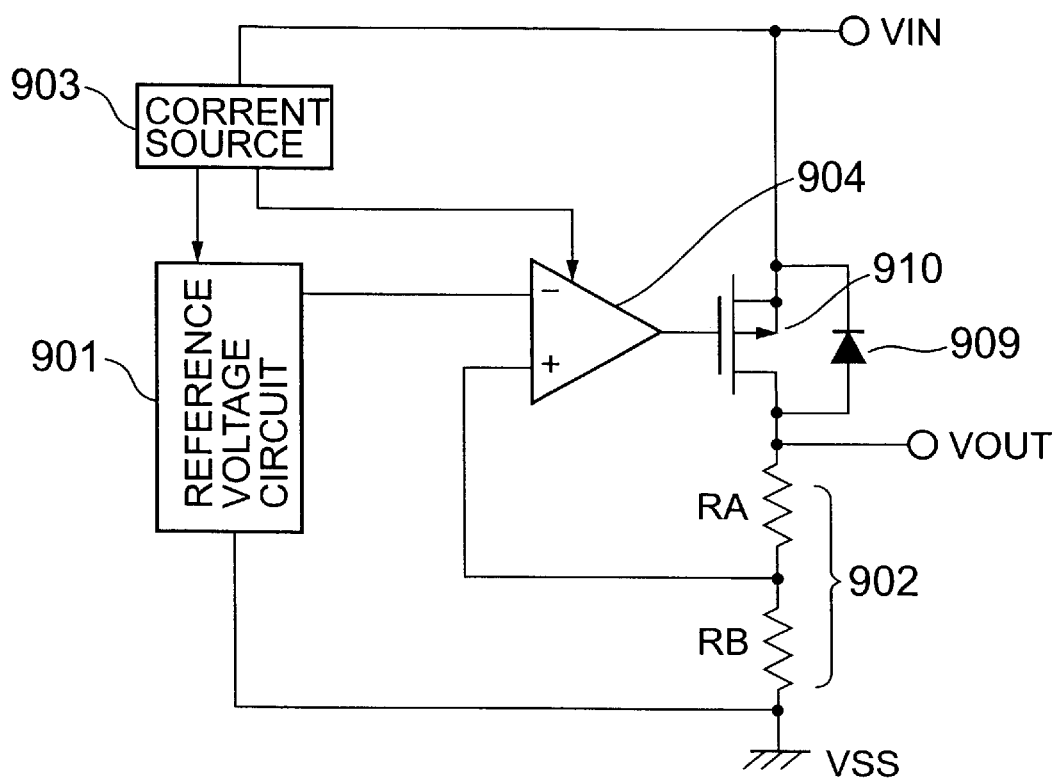
FIG. 3 is a block diagram showing an embodiment of a voltage regulator that employs a bleeder resistance circuit according to the present invention.

FIG. 3 is a block diagram showing an embodiment of a voltage regulator that employs a bleeder resistance circuit according to the present invention.

An example of a simple circuit is illustrated in order to describe briefly. However, the functions of an actual production may be added, if necessary.

The basic circuit components of the voltage regulator comprise the current source 903, the reference voltage circuit 901, a bleeder resistance circuit 902, the error amplifier 904, a P-type transistor 910 that serves as a current control transistor, and the like. The partial description of operations is briefly made below.

The error amplifier 904 compares the voltage divided by the bleeder resistance circuit 902 with the reference voltage generated in the reference voltage circuit 901 and supplies the gate voltage, which is required for obtaining the constant output voltage VOUT that is not affected by the input voltage VIN or temperature change, to the P-type transistor 910. As in the case with the voltage detector illustrated in FIG. 2, the basic operations of the voltage regulator are performed by comparing the reference voltage generated in the reference voltage circuit 901 with the voltage divided by the bleeder resistance circuit 902 in the error amplifier 904. Thus, the accuracy of the voltage divided by the bleeder resistance circuit 902 becomes considerably important. When the accuracy of the voltage divided by the bleeder resistance circuit 902 is low, the input voltage to the error amplifier 904 is varied, thereby becoming impossible to obtain the predetermined output voltage VOUT. When the bleeder resistance circuit according to the present invention is employed, the voltage division can be effected with high precision even after the resin-packaging of an IC. Therefore, production yield of ICs is improved and a voltage regulator with higher precision can be manufactured.

Further, the P-type transistor 910 is one that is usually called a driver transistor and requires a high current driving capacity. In the present invention, the P-type polysilicon thin film having high impurity concentration is employed for the gate electrode, thereby enabling the formation of a surface channel type device. As a result, the transistor gate length for suppressing a leak current to a constant level (the so-called L length) can be shortened in comparison with a normal P-type MOS transistor including the gate electrode of the N-type polysilicon thin film, thereby allowing the high current driving capacity to be exerted.

As described above, the thin film resistor of the semiconductor device according to the present invention is composed of the P-type thin film resistor that is formed form the P-type semiconductor thin film and the N-type thin film resistor that is formed from the N-type semiconductor thin film. Even when stress is applied by resin-packaging or the like, the changes of the resistance values of the individual resistors offset each other, thereby being capable of maintaining the initial resistance value. Also, in the bleeder resistance circuit, the resistance value that serves as the single unit is regulated by the resistance value obtained by coupling the P-type thin film resistor with the N-type thin film resistor, thereby being capable of maintaining the accurate voltage division ratio. Further, the P-type resistor is disposed at the high potential side, and a laser beam or the like is irradiated to the insulating film portion to destroy the insulating property thereof to thereby achieve conductivity between the P-type and N-type resistors. Thus, the fuse that has been required in a conventional manner can be made unnecessary. Still further, the current driving capacity of the driver transistor that serves as the P-type MOS transistor can be improved without adding special processes.

When the above bleeder resistance circuit is employed, there is obtained such an effect that the compact and high-precision semiconductor device such as the voltage detector or voltage regulator can be obtained.

What is claimed is:

1. A semiconductor device comprising: a MOS transistor and a resistor; the resistor comprising a P-type resistor formed from a P-type semiconductor, an N-type resistor formed from an N-type semiconductor and disposed adjacent the P-type resistor, and an insulating film disposed between the P-type and N-type resistors; the P-type resistor being disposed at a low potential side of the semiconductor device and the N-type resistor being disposed at a high potential side; and a portion of the insulating film between the P-type and N-type resistors being made electrically conductive to thereby achieve conductivity between the P-type and N-type resistors.

2. A semiconductor device according to claim 1 wherein the resistor is formed from polysilicon.

3. A semiconductor device according to claim 1, wherein the semiconductor device is a voltage detector.

4. A semiconductor device according to claim 1, wherein the semiconductor device is a voltage regulator.

5. A semiconductor device according to claim 1, wherein a gate electrode of the MOS transistor and the P-type resistor are formed of the same polysilicon thin film, and a high concentration impurity region of the P-type resistor for making electrical connection with a metal wiring is formed from a polyisilicon thin film having the same impurity, and impurity concentration as those of the gate electrode of the MOS transistor.

6. A semiconductor device comprising: a resistor having a P-type resistor formed from a P-type semiconductor, an N-type resistor formed from an N-type semiconductor and disposed adjacent the P-type resistor, and an insulating film disposed between the P-type and N-type resistors; the P-type resistor being arranged at the low potential side of the semiconductor device and the N-type resistor being arranged at the high potential side; and a portion of the insulating film between the P-type and N-type resistors being made electrically conductive to thereby achieve conductivity between the P-type and N-type resistors.

7. A semiconductor device according to claim 6, wherein the P-type and N-type resistors are formed from an impurity-diffused resistor provided in a single crystal silicon substrate.

8. A semiconductor device according to claim 6 wherein the resistor is formed from polysilicon.

9. A semiconductor device according to claim 6, wherein the semiconductor device is a voltage detector.

10. A semiconductor device according to claim 6, wherein the semiconductor device is a voltage regulator.

* * * * *